US010418073B1

(12) United States Patent
Venkata et al.

(10) Patent No.: US 10,418,073 B1
(45) Date of Patent: Sep. 17, 2019

(54) POWER NOISE REDUCTION TECHNIQUE FOR HIGH DENSITY MEMORY WITH FREQUENCY ADJUSTMENTS

(71) Applicant: Micron Technology, Inc., Boise, ID (US)

(72) Inventors: Harish N. Venkata, Allen, TX (US); Yu-Feng Chen, Plano, TX (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/163,728

(22) Filed: Oct. 18, 2018

(51) Int. Cl.
| G05F 1/10 | (2006.01) |
| G11C 5/14 | (2006.01) |
| H02M 3/07 | (2006.01) |
| G11C 16/30 | (2006.01) |

(52) U.S. Cl.
CPC .............. *G11C 5/145* (2013.01); *G11C 16/30* (2013.01); *H02M 3/073* (2013.01)

(58) Field of Classification Search
None
See application file for complete search history.

(56) References Cited

U.S. PATENT DOCUMENTS

| 9,479,050 | B1 * | 10/2016 | Reddy | H02M 3/07 |
| 10,199,113 | B2 * | 2/2019 | Kim | G11C 5/14 |
| 2008/0181046 | A1 * | 7/2008 | Vergnes | G06F 13/1689 |
| | | | | 365/233.1 |
| 2008/0291758 | A1 * | 11/2008 | Chu | G11C 7/1051 |
| | | | | 365/194 |
| 2010/0091537 | A1 * | 4/2010 | Best | G11C 5/02 |
| | | | | 365/51 |
| 2013/0083611 | A1 * | 4/2013 | Ware | G11C 11/4072 |
| | | | | 365/191 |
| 2016/0380532 | A1 * | 12/2016 | Reddy | H02M 3/07 |
| | | | | 365/185.18 |
| 2017/0154666 | A1 * | 6/2017 | Park | G11C 5/145 |
| 2018/0293025 | A1 * | 10/2018 | Sakai | G06F 12/00 |

* cited by examiner

*Primary Examiner* — Lincoln D Donovan
*Assistant Examiner* — Khareem E Almo
(74) *Attorney, Agent, or Firm* — Fletcher Yoder, P.C.

(57) ABSTRACT

Memory devices may have internal circuitry that employs voltages higher than voltages provided by an external power source. Charge pumps are DC/DC converters that may be used to generate, internally, higher voltages for operation. The available charge pumps in a memory device may be adjusted through adjustment of the operation frequency of oscillating circuitry that drives the charge pump. Delay elements may also be adjusted to facilitate operation of the charge pump.

20 Claims, 2 Drawing Sheets

POWER NOISE REDUCTION TECHNIQUE FOR HIGH DENSITY MEMORY WITH FREQUENCY ADJUSTMENTS

BACKGROUND

1. Field of the Present Disclosure

This disclosure relates to memory devices, and more specifically, to charge pump supply circuitry in memory devices.

2. Description of Related Art

Memory devices, such as random access memory (RAM) devices, dynamic RAM devices (DRAMs), static RAM devices (SRAMs), or flash memories, are often used in electronic systems to provide memory functionality to facilitate data processing operations and/or facilitate data storage during data processing operations. To that end, these memory devices may have addressable memory elements arranged in memory arrays and/or banks. These memory devices may also include an input/output (I/O) interface that provides data access between memory elements and processing circuitry (e.g., a processor, a microcontroller, a system-on-chip). The I/O interface of the memory device may be coupled to the memory elements through an internal data path that may include circuitry for reading or writing data bits in the memory elements.

Several operations in the memory device may employ voltages that may be higher than the power supply voltages of the memory device. For example, certain memory devices may be coupled to a power supply with a voltage of about 1.2V and/or about 2.5V, and may have certain operations that employ voltages in a range such as between 4.5V-5V. To perform such operations, charge pump power supplies, may be employed to provide higher voltages. More generally, charge pumps may be voltage generators that may provide voltages larger than input voltages. As the current and voltage demands of memory devices increase with memory density and memory speed, improvements in the charge pump technology may allow reduced voltage, and thus, more reliable systems.

BRIEF DESCRIPTION OF THE DRAWINGS

Various aspects of this disclosure may be better understood upon reading the following detailed description and upon reference to the drawings in which.

DETAILED DESCRIPTION

Figure 1:
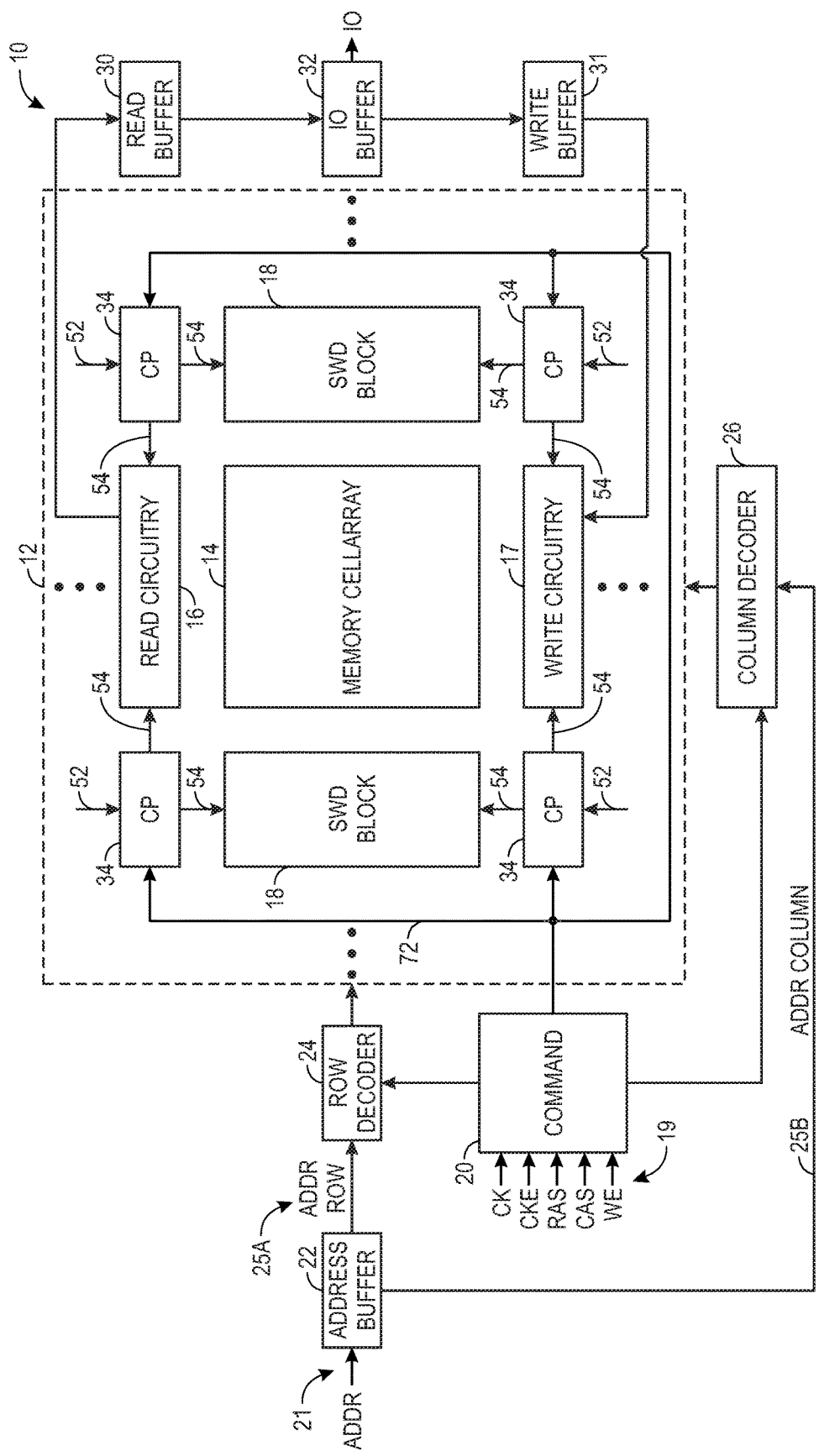
FIG. 1 is a block diagram of a memory device with tunable charge pumps, in accordance with an embodiment.

One or more specific embodiments will be described below. In an effort to provide a concise description of these embodiments, not all features of an actual implementation are described in the specification. It may be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it may be appreciated that such a development effort might be complex and time consuming, but would nevertheless be a routine undertaking of design, fabrication, and manufacture for those of ordinary skill having the benefit of this disclosure.

Many electronic systems may employ memory devices to provide data storage functionalities and/or facilitate the performance of data processing operations. Several memory devices may store data using addressable memory elements (e.g., memory rows or columns), which may be disposed in memory banks. Examples of addressable memory devices include random access memory (RAM) devices, dynamic RAM (DRAM) devices such as synchronous DRAM (SDRAM) devices, double data rate SDRAM devices (e.g., DDR SDRAM, DDR2 SDRAM, DDR3 SDRAM, DDR4 SDRAM), and graphics DDR SDRAM devices (e.g., GDDR3 SDRAM, GDDR4 SDRAM), as well as static RAM (SRAM) devices, and/or flash memory devices, among others.

Processing circuitry in the electronic systems may access (e.g., read/write) the memory elements by interacting with an input/output (I/O) interface and a command interface. As an example, a processor may store information by providing a write command and/or an address for a memory element, and read stored information from a particular memory element from the memory device by providing a read command and/or an address. The commands and/or addresses may be provided via the command interface, and the requested information (e.g., data bits) may be retrieved via the I/O interface.

The power to perform memory operations, such as read, write, refresh, activate (e.g., row activation, column activation), or pre-charge (e.g., row deactivation, column deactivation) operations, may be obtained from power supply connections (e.g., power supply ($V_{DD}$), activating power supply ($V_{PP}$), ground supply ($V_{SS}$)) with the electronic device. For example, the memory device may have external connections (e.g., pins) associated with power supply connections, which may be coupled to pins in a socket of a printed circuit board (e.g., a motherboard). The voltages and tolerances of the power supply connection may be specified in a standard for the memory device. For example, DDR4 may include a $V_{DD}$ specification of about 1.2V and a $V_{PP}$ specification of about 2.5V. However, certain operations within the memory device may benefit from a higher voltage or lower voltage (e.g., higher than 2.5V, lower than 0V). To that end, the memory devices may include analog power supplies, such as charge pumps and/or charge pump cores, (e.g., charge pumps), which may be DC/DC converters that generate higher voltages from the voltages provided by the power supply lines.

Charge pumps may, in general, generate voltage increases by employing a switching device (e.g., a transistor) or some of switching to controls connections across energy storage devices (e.g., a capacitor). Based on, among other things, the switching frequency, the duty cycle of the switching signal, and the input voltages, a target output voltage and/or the current capacity of the charge pump may be adjusted. Operation of charge pumps may demand substantial currents during short periods of time, to charge the energy storage devices. As a result, operation of charge pumps may cause interference with other circuitry in the memory devices.

Examples of such interference include voltage drop noise (IR drop noise), which may be caused by the competition for electrical power during due to the large currents used by the charge pump.

Memory devices may include several charge pumps and, conventionally, all charge pumps are enabled upon request. As the size of memory devices increases and the number of on-die memory increases (e.g., 8 Gb, 16 Gb, 32 Gb per memory die), the number charge pumps on the die may become large. Due to the impact on the operation of the memory devices, strategies for moderation in the use of charge pumps during operation may lead to improvements in the performance of the memory device. Embodiments described herein include systems and methods for memory devices that may dynamically tune the charge output (e.g., charge, current) of charge pumps based on the charge demands of the memory device. To that end, the oscillator that drives the charge pumps may be programmed to operate at a higher or lower frequency. Moreover, to provide an even distribution of load across the multiple charge pump cores of the charge pump, programmable delay elements may be used to adjust the delays in accordance with the operation frequency of the pump core.

With the foregoing in mind, FIG. 1 is a block diagram of a memory device 10 in accordance with an embodiment of the present invention. The memory device 10 may have one or more memory banks 12, which may include one or more memory cell arrays 14. Each memory cell array 14 may be coupled to read circuitry, such as one or more read blocks 16 (e.g., sense amplify circuitry) that may facilitate read operations and write circuitry, such as write blocks 17 that may facilitate write operations. In some embodiments, a single block may be used to perform part or all of the functions performed by the read blocks 16 and the write blocks 17. Read blocks 16 and/or write blocks 17 may operate by amplifying and coordinating local input/output (I/O) lines coupled to the memory cell array 14. The memory cell array 14 may also be coupled to subword driver (SWD) blocks 18. The SWD blocks 18 may facilitate read and write operations by providing signals to activate memory rows or memory columns in the memory cell array 14. Charge pumps 34 may be disposed on the memory device (e.g., near memory banks 12 in the periphery of the memory device die, etc.) to provide an electrical signal 28 the read blocks 16, write blocks 17, and/or the SWD blocks 18. Moreover, charge pumps 34 may receive one or more electrical power signals 52, (e.g., $V_{DD}$, $V_{PP}$, $V_{SS}$).

The logic blocks in the memory banks 12 may be controlled by clock and/or command signals 19, which may be received by a command block 20. Command block 20 may decode the clock and/or command signals 19 to generate various internal signals to control internal data circuitry, such as address buffers 22, decoders such as row decoder 24 and column decoder 26, read buffer 30, write buffer 31, charge pumps 34, and/or input/output (I/O) buffer 32. For example, when an operation demands a high voltage signal 54 from the charge pumps 34, the command block 20 may provide instructions 72 to activate the charge pumps 34 and provide the high voltage signal 54 based on the device power signals 52. In order to address data, the address buffer 22 may receive address signal 23. The clock and/or command signals 19 and the address signal 23 may be provided by processing circuitry coupled to the memory device, as discussed above.

In order to manipulate data at an address, an external device may also provide an address signal 21, in addition to the clock and/or command signals 19. The address signal 21 may be decoded in the address buffer 22 into a row address 25A and column address 25B. The row address 25A may be provided to a row decoder 24 and the column address 25B may be provided to a column decoder 26. The row decoder 24 and the column decoder 26 may be used to control the appropriate SWD block 18 to activate the memory cells associated with the requested address signal 23.

For example, in a read operation, the memory cells associated with the row address 25A and the column address 25B may be activated by a SWD block 18, the read block 16 may generate a data read signal, and read buffer 30 and I/O buffer 32 may amplify and transport the read data to an external device. During a write operation, the memory cells associated with the row address 25A and the column address 25B may be activated by the SWD block 18, the I/O buffer 32 may latch the incoming data from the external device, and the write buffer 31 and the write block 17 may store the read data to an external device. Other operations may also be performed, such as refresh operation that refreshes the data in the entire memory device. In the refresh operation, the SWD block 18 may activate all rows in the memory cell array 14 to avoid data loss. In the processes related with these operations, the charge pumps 34 may be activated and/or de-activated to provide adequate voltages, as discussed above.

Figure 2:
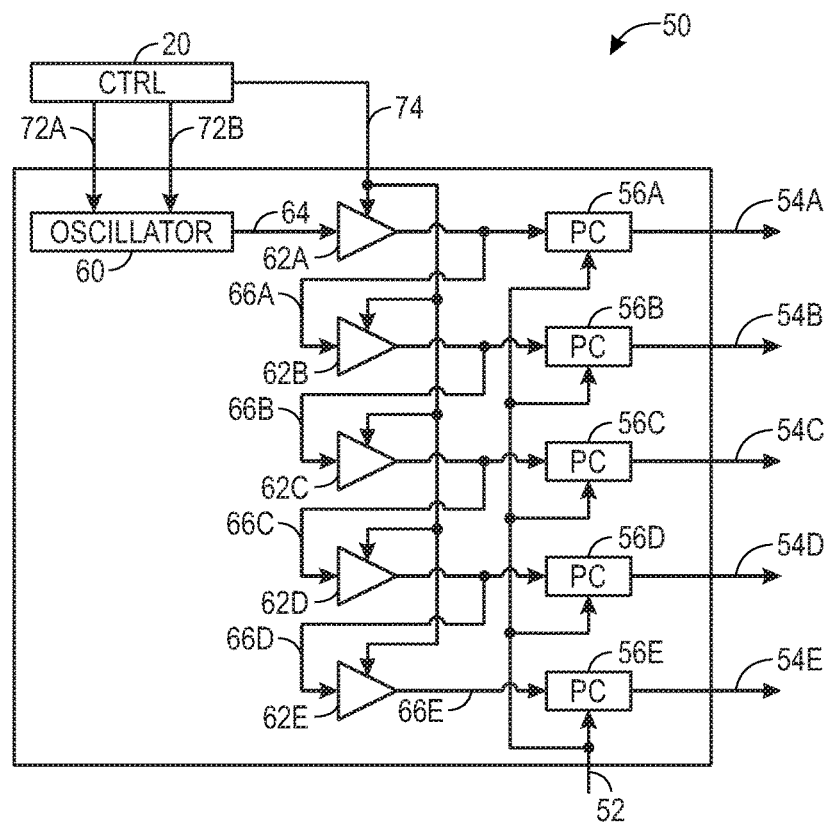
FIG. 2 is a block diagram of a tunable charge pump circuit that may include a programmable oscillator and programmable delay elements to tune a charge output, in accordance with an embodiment.

FIG. 2 illustrates a block diagram 50 of a charge pump 34, which may enabled or disabled, as discussed herein. The block diagram 50 is provided to illustrate general functionality of a charge pump 34, and it is understood that the methods and systems described herein may be adjusted and/or applied to other charge pump systems or other similar DC/DC converters. As illustrated, the charge pump 34 may operate as a DC/DC converter that receives one or more input power signals 52 and may provide output electrical signals with a higher voltage. To that end, the charge pump 34 may have pump cores 56A, 56B, 56C, 56D, 56E, and 56E, which may provide output electrical signals 54A, 54B, 54C, 54D, and 54E, which may include switching circuitry and energy storage circuitry. The switching circuitry may include, for example, transistors and/or diodes and the energy storage circuitry may include, for example, capacitors.

Charge pump 34 may also include a pump controller 58 and a pump oscillator 60. The pump oscillator 60 may provide an oscillator signal 64 that regulates the operation of the pump cores 56. The frequency and/or the duty cycle from the signal 62 may be controlled to change the voltage level and/or the available current of the output electrical signal 54. The pump controller 58 may include or be coupled to sensors (e.g., voltage sensors or other feedback circuitry) that monitor the output electrical signal 54A-E of the pump cores 56A-E and adjust the operation of the pump oscillator 60 accordingly. For example, if the current demands on the pump cores 56A-F cause a voltage drop in the output electrical signal 54A-E, the pump controller 58 may sense the voltage drop and cause the oscillator 60 to increase its frequency to provide more charge.

The charge pump 34 may also receive a control signal from a memory device controller (e.g., command block 20) to adjust the operation of the pump oscillator. For example, control signals 72A and 72B may be used to request an increase or a decrease in the frequency of the oscillator signal 64. The changes in the frequency of the oscillator signal 64 may be incremental (e.g., quantized, discretized). While an incremental operation is described herein, other forms of control signals may be used by the memory device controller to request a particular adjustment to the frequency of the oscillator signal 64. In general, an increase in the frequency of the oscillator signal 64 may be requested prior to memory operations that have a high charge demand and a decrease in the frequency of the oscillator signal 64 may be requested prior to memory operations that have a low charge demand.

The charge pump 34 may also include delay elements 62A, 62B, 62C, 62D, and 62E. The delay elements 62A-E may be arranged in a chain that may be used to add phase shifts to the oscillator signal 64. As a result, the chain of delay elements 62A-E may generate delayed oscillator signals 66A, 66B, 66C, 66D, and 66E that may have substantially similar frequencies and evenly distributed phases. The even distribution of phases may cause a distribution in the active periods of across charge pump cores 56A-E. For example, if the charge pump 34 with 5 charge pump cores 56A-E has an oscillator 60 providing an oscillator signal 64 at a frequency of 100 MHz (i.e., period of 10 ns), each of the delay elements 62A-E may insert a 2 ns delay to provide a 72° phase shift. As a result, all the charge pump cores 56A-E will be active at different times, which may balance the charge demands.

As discussed above, the oscillator 60 may be programmed in view of charge demands. In order to substantially preserve the phase shift and the balanced charge demands across the pump cores 56A-E, the memory device controller 20 may use a control signal 74 to program the delay elements 62A-E. In general, increases to the frequency of the oscillator signal 64 may be accompanied by reductions in the delays inserted by delay elements 62A-E. In general, a charge pump driving N pump cores and operating at a frequency f may provide a balanced charge demand if the delay elements insert a delay period $\tau=(N\times f)^{-1}$. In embodiments where the delay elements 62A-E are programmed incrementally (e.g., quantized, discretized), the delays may be adjusted to values that approximate the ideal delay period (e.g., within 5% of the ideal delay period, within 5% of the target frequency).

Figure 3:
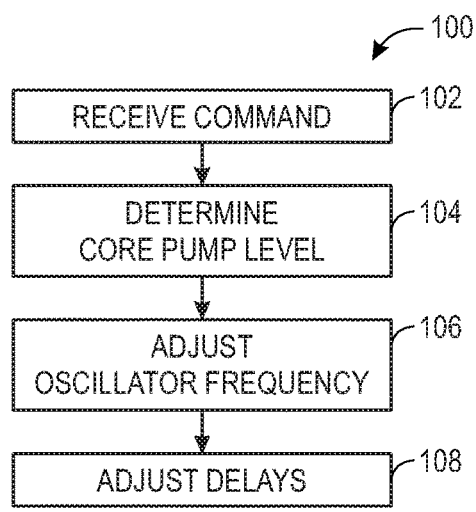
FIG. 3 is a flow chart illustrating tuning the charge of the output electrical signals provided by pump circuitry during operation of a memory device, in accordance with an embodiment.

FIG. 3 illustrates a method 100 for selective activation of charge pump cores, as discussed above. In a process block 102, a command may be received by a controller in the memory device (e.g., command block 20). The command may be a memory device operation, such as read instruction, a write instruction, or a refresh instruction. In a process block 104, the controller may determine a charge demand associated with the command (e.g., current demand, voltage demand). The controller may, based on the charge demand, determine a target frequency for the oscillator 60 of the charge pump 34 in process block 104. In some embodiments, a target frequency may be determined. In other embodiments, a relative control (e.g., request for increase, request for decrease) may be determined. The relationship between the command and the target frequency for the oscillator 60 may be stored in a memory and/or a logic block within the memory device. In a process block 106, the controller may send control signals (e.g., control signals 72A and/or 72B) to adjust the oscillator frequency. In a process block 108, the controller may send control signals (e.g., control signal 74) to adjust the delay added by delay elements 62A-E. The adjustment of the delay may be performed to substantially preserve the phase differences between delayed oscillator signals, as discussed above. The application of method 100 during operation of the memory device may allow dynamic adjustment to the charge output of the charge pump.

While the embodiments set forth in the present disclosure may be susceptible to various modifications and alternative forms, specific embodiments have been shown by way of example in the drawings and have been described in detail herein. However, it may be understood that the disclosure is not intended to be limited to the particular forms disclosed. The disclosure is to cover all modifications, equivalents, and alternatives falling within the spirit and scope of the disclosure as defined by the following appended claims.

What is claimed is:

1. A memory device comprising:
    a charge pump comprising:
        an oscillator; and
        a set of charge pump cores, each charge pump core configured to receive an oscillator signal from the oscillator, and a first voltage, and to generate a second voltage higher than the first voltage; and
    a memory controller configured to:
        receive an instruction associated with a memory operation; and
        generate a first control signal to the oscillator of the charge pump based on the instruction, wherein the first control signal is configured to adjust a frequency of the oscillator signal.

2. The memory device of claim 1, wherein the charge pump comprises a set of delay elements arranged in a chain, wherein the set of delay elements is configured to receive the oscillator signal and to provide a set of delayed oscillator signals, wherein each charge pump core of the set of charge pump cores is configured to receive a respective delayed oscillator signal, and wherein the memory controller is configured to generate a second control signal configured to adjust a delay of at least one delay element of the set of delay elements.

3. The memory device of claim 2, wherein the set of charge pump cores has a number N of charge pump cores, the oscillator signal has a frequency f, and the second control signal is configured to adjust the delay of the at least one delay element to a period equal to $(f\times N)^{-1}$.

4. The memory device of claim 1, wherein the first voltage comprises an activating power supply ($V_{PP}$), or a power supply ($V_{DD}$).

5. The memory device of claim 1, wherein the memory operation comprises an operation that has a high charge demand, and wherein the first control signal comprises a frequency increase request.

6. The memory device of claim 1, wherein the memory operation comprises an operation that has a low charge demand, and wherein the control signal comprises a frequency decrease request.

7. The memory device of claim 1, wherein the memory operation comprises a read operation, a write operation, or a refresh operation.

8. A memory device comprising:
    a plurality of memory cells;
    a controller configured to receive a first memory operation of a plurality of memory operations;
    first circuitry configured to perform the first memory operation;
    a charge pump comprising:
        an oscillator configured to receive a first control signal from the controller configured to change a frequency of an oscillator signal provided by the oscillator; and
        a plurality of charge pump cores, wherein each charge pump core is configured to receive the oscillator signal and a first voltage, and to generate a second voltage higher than the first voltage, wherein the second voltage is configured to power the first circuitry during performance of the first memory operation, and wherein a charge associated with the second voltage is based on the frequency of the oscillator signal.

9. The memory device of claim 8, comprising a memory die that comprises the plurality of memory cells, wherein the memory die comprises 8 Gb, 16 Gb, or 32 Gb.

10. The memory device of claim 8, wherein the charge pump comprises a plurality of delay elements arranged in a chain that receives the oscillator signal, wherein the plurality of delay elements is configured to generate a plurality of delayed oscillator signals and each charge pump core is configured to receive one delayed oscillator signal of the plurality of delayed oscillator signals.

11. The memory device of claim 10, wherein the controller is configured to generate a second control signal that adjusts a delay of each delay element of the plurality of delay elements.

12. The memory device of claim 11, wherein the plurality of charge pump cores has a number N of charge pump cores, the oscillator signal has a frequency f, and the second control signal is configured to adjust each delay element of the plurality of delay elements to cause the delay to be approximately $(f \times N)^{-1}$.

13. The memory device of claim 11, wherein the first control signal is configured to increase the frequency and the second control signal is configured to reduce the delay.

14. The memory device of claim 8, wherein the plurality of memory operations comprises a read operation, a write operation, or a refresh operation.

15. The memory device of claim 8, wherein the first voltage comprises an activating power supply ($V_{PP}$), or a power supply ($V_{DD}$).

16. A method for controlling charge pump circuitry of a memory device, comprising:
   receiving, in a controller, a command for a memory operation of a set of operations;
   determining, in the controller, a charge demand based in part on the memory operation;
   determining, in the controller, an adjustment to a frequency of an oscillator of the charge pump circuitry; and
   providing a first control signal from the controller to the oscillator of the charge pump circuitry to cause a change to the frequency of the oscillator.

17. The method of claim 16, comprising providing a second control signal from the controller to a delay element of the charge pump circuitry, based on the adjustment to the frequency of the oscillator, wherein the delay element is configured to receive an oscillator signal from the oscillator and generate a delayed oscillator signal to a charge pump core of the charge pump circuitry.

18. The method of claim 17, wherein the charge pump circuitry comprises N charge pump cores, the frequency of the oscillator has a value f, and the second control signal is configured to adjust the delay element to cause the delay approximately equal to $(f \times N)^{-1}$.

19. The method of claim 16, wherein the first control signal comprises an increase of frequency request or a decrease of frequency request.

20. The method of claim 16, wherein the first control signal comprises a target frequency request.

* * * * *